(12) United States Patent
He

(10) Patent No.: US 11,793,019 B2
(45) Date of Patent: Oct. 17, 2023

(54) LIGHT-EMITTING PANEL AND DISPLAY DEVICE INCLUDING BLOCKING STRUCTURE HAVING A RECESSED STRUCTURE

(71) Applicant: Wuhan China Star Optoelectronics Semiconductor Display Technology Co., Ltd., Hubei (CN)

(72) Inventor: Ruiting He, Wuhan (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 478 days.

(21) Appl. No.: 16/625,694

(22) PCT Filed: Sep. 30, 2019

(86) PCT No.: PCT/CN2019/109283
§ 371 (c)(1),
(2) Date: Dec. 21, 2019

(87) PCT Pub. No.: WO2021/012389
PCT Pub. Date: Jan. 28, 2021

(65) Prior Publication Data
US 2021/0408454 A1    Dec. 30, 2021

(30) Foreign Application Priority Data
Jul. 22, 2019  (CN) .......................... 201910661365.1

(51) Int. Cl.
*H01L 51/00*   (2006.01)
*H01L 51/50*   (2006.01)
(Continued)

(52) U.S. Cl.
CPC .... *H01L 51/5253* (2013.01); *G02F 1/133305* (2013.01); *G09F 9/301* (2013.01);
(Continued)

(58) Field of Classification Search
CPC ............. H01L 51/5253; H01L 51/0097; H01L 51/5088; H01L 51/5072; H01L 27/3241;
(Continued)

(56) References Cited

U.S. PATENT DOCUMENTS 8,946,747 B2 * 2/2015 Reiherzer ............... H01L 33/54
257/94
10,079,362 B2 * 9/2018 Kim ........................ H01L 51/56
(Continued)

FOREIGN PATENT DOCUMENTS

CN    106601781 A     4/2017
CN    206610830 U  *  11/2017
(Continued)

*Primary Examiner* — Ida M Soward
(74) *Attorney, Agent, or Firm* — PV IP PC; Wei Te Chung; Ude Lu

(57) ABSTRACT

The present disclosure discloses a light-emitting panel and a display device. The light-emitting panel comprises: a light-emitting substrate having a light-emitting surface; and a blocking structure disposed surrounding the light-emitting substrate and not covering the light-emitting surface; wherein a recessed structure is disposed on a first surface of the blocking structure, and the first surface is on a same side as the light-emitting surface.

20 Claims, 4 Drawing Sheets

(51) Int. Cl.
*H01L 51/52* (2006.01)
*H01L 27/32* (2006.01)
*G02F 1/133* (2006.01)
*G02F 1/1333* (2006.01)
*G09F 9/30* (2006.01)

(52) U.S. Cl.
CPC ...... *H01L 27/3272* (2013.01); *H01L 51/0097* (2013.01); *H01L 51/5072* (2013.01); *H01L 51/5088* (2013.01); *H01L 2251/301* (2013.01); *H01L 2251/5338* (2013.01)

(58) Field of Classification Search
CPC .......... H01L 27/3272; H01L 2251/301; H01L 2251/5338; G02F 1/133305; G09G 9/301; G09F 9/301
See application file for complete search history.

(56) References Cited

U.S. PATENT DOCUMENTS

| | | | |
|---|---|---|---|
| 11,081,671 B2* | 8/2021 | Zhang | H01L 51/5256 |
| 11,228,006 B2* | 1/2022 | Dong | H01L 51/56 |
| 2012/0048462 A1* | 3/2012 | Lee | B32B 37/185 |
| | | | 156/272.8 |
| 2013/0334959 A1* | 12/2013 | Wang | H01L 51/5256 |
| | | | 313/512 |
| 2016/0365539 A1* | 12/2016 | Wang | H01L 31/12 |
| 2017/0117504 A1* | 4/2017 | Kim | H01L 51/5256 |
| 2017/0194397 A1* | 7/2017 | Kim | H01L 27/3246 |
| 2017/0243933 A1 | 8/2017 | Kuriyagawa | |
| 2018/0104915 A1* | 4/2018 | Liu | B32B 3/263 |
| 2018/0151833 A1* | 5/2018 | Riegel | H01L 51/5237 |
| 2019/0326544 A1* | 10/2019 | Huang | H01L 51/5253 |
| 2019/0372056 A1* | 12/2019 | Lee | H01L 51/5275 |
| 2020/0052245 A1* | 2/2020 | Qiao | H01L 27/3246 |
| 2020/0058899 A1* | 2/2020 | Bu | B32B 7/12 |
| 2020/0373519 A1* | 11/2020 | Wang | H01L 51/5253 |
| 2021/0234129 A1* | 7/2021 | Zhang | H01L 27/3258 |
| 2021/0257586 A1* | 8/2021 | Guo | H01L 51/56 |
| 2021/0336216 A1* | 10/2021 | Liu | H01L 51/5253 |

FOREIGN PATENT DOCUMENTS

| | | | |
|---|---|---|---|
| CN | 108539041 A | 9/2018 | |
| CN | 109638173 A | 4/2019 | |
| CN | 109860411 A | 6/2019 | |
| WO | WO-2020238379 A1 * | 12/2020 | ......... H01L 27/3246 |

\* cited by examiner

LIGHT-EMITTING PANEL AND DISPLAY DEVICE INCLUDING BLOCKING STRUCTURE HAVING A RECESSED STRUCTURE

FIELD OF INVENTION

The present disclosure relates to the field of display technologies, and more particularly to a light-emitting panel and a display device.

BACKGROUND OF INVENTION

In recent years, as organic light emitting diodes (OLEDs) have a lot of advantages, such as self-illumination, low energy consumption, wide viewing angles, rich color, fast responses, and able to prepare flexible screens, OLEDs have aroused great interest in the scientific research community and industry, and are considered to be a promising next-generation display technology.

Currently, in order to isolate erosion of water and oxygen on OLEDs, thin film encapsulation (TFE) is usually used to perform encapsulation on OLEDs, and an encapsulation layer having inorganic/organic/inorganic overlapped multi-layered films is formed. When forming an organic layer, ink jet printing (IJP) is usually used to spray-coating a liquid ink on an inorganic layer formed before, and then the liquid ink is cured to form the organic layer. However, when the spray-coated liquid ink is excessive that causes the liquid ink to overflow, it will cause that an inorganic layer formed on the organic layer cannot completely cover the organic layer, thereby invalidating encapsulation and reducing product yield.

Therefore, there are defects in current technology and there is an urgent need for improvement.

an embodiment of the present disclosure provides a light-emitting panel to prevent invalid encapsulation and to improve product yield.

SUMMARY OF INVENTION

At first aspect, an embodiment of the present disclosure provides a light-emitting panel. The light-emitting panel comprises:

a light-emitting substrate having a light-emitting surface; and a blocking structure disposed surrounding the light-emitting substrate and not covering the light-emitting surface; wherein, a recessed structure is disposed on a first surface of the blocking structure, and the first surface is on a same side as the light-emitting surface.

In an embodiment of the present disclosure, the recessed structure comprises a plurality of first grooves disposed at intervals, and the first grooves are formed by first openings disposed on the first surface extending to an interior of the blocking structure.

In an embodiment of the present disclosure, a width of first intervals between the adjacent first openings is greater than or equal to an opening width of the first openings.

In an embodiment of the present disclosure, the first grooves comprise bottom walls and side walls disposed on the bottom walls, a plurality of second openings are disposed at intervals on the bottom walls, and the second openings extend to the interior of the blocking structure to form second grooves.

In an embodiment of the present disclosure, an opening width of the second openings is less than or equal to a width of the bottom walls.

In an embodiment of the present disclosure, an opening width of the first grooves gradually decreases along an extending direction of the first grooves.

In an embodiment of the present disclosure, a width of second intervals between adjacent second openings is greater than an opening width of the second openings.

In an embodiment of the present disclosure, a depth of the first grooves is equal to a depth of the second grooves.

In an embodiment of the present disclosure, the light-emitting substrate comprises a first display part, a second display part, and a bent portion, the bent portion is connected to the first display part and the second display part, and the recessed structure is disposed on a part of the first surface opposite to the bent portion.

At second aspect, an embodiment of the present disclosure further provides a display device. The display device comprises: a light-emitting panel and a case body, and the light-emitting panel which is disposed on the case body comprises:

a light-emitting substrate having a light-emitting surface; and a blocking structure disposed surrounding the light-emitting substrate and not covering the light-emitting surface; wherein, a recessed structure is disposed on a first surface of the blocking structure, and the first surface is on a same side as the light-emitting surface.

In an embodiment of the present disclosure, the recessed structure comprises a plurality of first grooves disposed at intervals, and the first grooves are formed by first openings disposed on the first surface extending to an interior of the blocking structure.

In an embodiment of the present disclosure, a width of first intervals between the adjacent first openings is greater than or equal to an opening width of the first openings.

In an embodiment of the present disclosure, the first grooves comprise bottom walls and side walls disposed on the bottom walls, a plurality of second openings are disposed at intervals on the bottom walls, and the second openings extend to the interior of the blocking structure to form second grooves.

In an embodiment of the present disclosure, an opening width of the second openings is less than or equal to a width of the bottom walls.

In an embodiment of the present disclosure, an opening width of the first grooves gradually decreases along an extending direction of the first grooves.

In an embodiment of the present disclosure, a width of second intervals between adjacent second openings is greater than an opening width of the second openings.

In an embodiment of the present disclosure, a depth of the first grooves is equal to a depth of the second grooves.

In an embodiment of the present disclosure, the light-emitting substrate comprises a first display part, a second display part, and a bent portion, the bent portion is connected to the first display part and the second display part, and the recessed structure is disposed on a part of the first surface opposite to the bent portion.

At third aspect, an embodiment of the present disclosure further provides a light-emitting panel. The light-emitting panel comprises:

a light-emitting substrate having a light-emitting surface; and a blocking structure disposed surrounding the light-emitting substrate and not covering the light-emitting surface; wherein, a recessed structure is disposed on a first surface of the blocking structure, the first surface is on a same side as the light-emitting surface, the recessed structure comprises a plurality of first grooves disposed at intervals, and the first grooves are formed by first openings disposed on the first surface extending to an interior of the blocking structure, the light-emitting substrate comprises a first display part, a second display part, and a bent portion, the bent portion is connected to the first display part and the second display part, and the recessed structure is disposed on a part of the first surface opposite to the bent portion.

In an embodiment of the present disclosure, a width of first intervals between the adjacent first openings is greater than or equal to an opening width of the first openings, the first grooves comprise bottom walls and side walls disposed on the bottom walls, a plurality of second openings are disposed at intervals on the bottom walls, and the second openings extend to the interior of the blocking structure to form second grooves.

An embodiment of the present disclosure provides a light-emitting panel. The light-emitting panel comprises: a light-emitting substrate having a light-emitting surface and a blocking structure disposed surrounding the light-emitting substrate and not covering the light-emitting surface; wherein, a recessed structure is disposed on a first surface of the blocking structure, and the first surface is on a same side as the light-emitting surface. It can make an overflowed liquid ink which forms an organic layer flow into the recessed structure by disposing the recessed structure on the first surface, thereby making an inorganic layer completely cover the organic layer, preventing encapsulation failure, and improving product yield.

DESCRIPTION OF DRAWINGS

The accompanying figures to be used in the description of embodiments of the present disclosure will be described in brief to more clearly illustrate the technical solutions of the embodiments. The accompanying figures described below are only part of the embodiments of the present disclosure, from which those skilled in the art can derive further figures without making any inventive efforts.

DETAILED DESCRIPTION OF PREFERRED EMBODIMENTS

Figure 1:
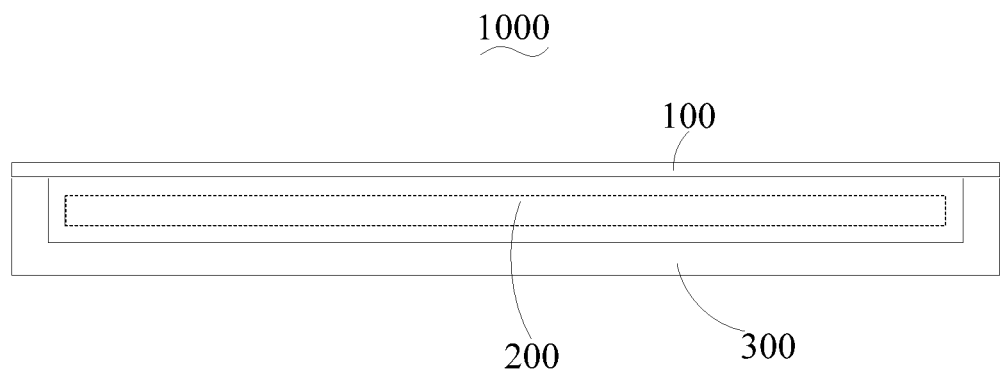
FIG. 1 is a schematic structural diagram of a display device according to an embodiment of the present disclosure.

The embodiments of the present disclosure are described in detail hereinafter. Examples of the described embodiments are given in the accompanying drawings. The specific embodiments described with reference to the attached drawings are all exemplary and are intended to illustrate and interpret the present disclosure. Based on the embodiments in the present disclosure, all other embodiments obtained by those skilled in the art without creative efforts are within the scope of the present disclosure.

In current technology, in order to isolate erosion of water and oxygen on organic light emitting diodes (OLEDs), thin film encapsulation (TFE) is usually used to perform encapsulation on OLEDs, and an encapsulation layer having inorganic/organic/inorganic overlapped multi-layered films is formed. when forming an organic layer, ink jet printing (IJP) is usually used to spray-coating a liquid ink on an inorganic layer formed before, and then the liquid ink is cured to form the organic layer. However, when the spray-coated liquid ink is excessive that causes the liquid ink to overflow, it will cause that an inorganic layer formed on the organic layer cannot completely cover the organic layer, thereby invalidating encapsulation.

To prevent the liquid ink, which forms an organic layer to overflow, a closed blocking structure is usually disposed surrounding the light-emitting device. However, when the liquid ink is excessive, the overflowed ink cannot spread to the surroundings, and will extend to the two upper and lower layers of the inorganic layers that causes the same invalid encapsulation problem. In addition, because flexible OLEDs have bendability, the encapsulation layer on the blocking structure will be subject to a large stress when bending, that leads to interlayer separation between inorganic/organic/inorganic layers of the encapsulation layer, thereby causing invalid encapsulation.

An embodiment of the present disclosure further provides a display device. The display device comprises: a light-emitting panel and a case body, and the light-emitting panel which is disposed on the case body comprises:

a light-emitting substrate having a light-emitting surface; and a blocking structure disposed surrounding the light-emitting substrate and not covering the light-emitting surface; wherein, a recessed structure is disposed on a first surface of the blocking structure, and the first surface is on a same side as the light-emitting surface.

Wherein, the recessed structure comprises a plurality of first grooves disposed at intervals, and the first grooves are formed by first openings disposed on the first surface extending to an interior of the blocking structure.

Wherein, a width of first intervals between the adjacent first openings is greater than or equal to an opening width of the first openings.

Wherein, the first grooves comprise bottom walls and side walls disposed on the bottom walls, a plurality of second openings are disposed at intervals on the bottom walls, and the second openings extend to the interior of the blocking structure to form second grooves.

Wherein, an opening width of the second openings is less than or equal to a width of the bottom walls.

Wherein, an opening width of the first grooves gradually decreases along an extending direction of the first grooves.

Wherein, a width of second intervals between adjacent second openings is greater than an opening width of the second openings.

Wherein, a depth of the first grooves is equal to a depth of the second grooves.

Wherein, the light-emitting substrate comprises a first display part, a second display part, and a bent portion, the bent portion is connected to the first display part and the second display part, and the recessed structure is disposed on a part of the first surface opposite to the bent portion.

Referring to FIG. 1, FIG. 1 is a schematic structural diagram of a display device 1000 according to an embodiment of the present disclosure. The display device 1000 comprises a light-emitting panel 100, a control circuit 200, and a case body 300. It should be noted that, the display device 1000 as shown in FIG. 1 is not limited to the above content and can further comprise other devices, such as a camera, an antenna structure, and a pattern unlocking module.

Wherein, the light-emitting panel 100 is disposed on the case body 300.

In some embodiments, the light-emitting panel 100 can be fixed to the case body 300, and the light-emitting panel 100 and the case body 300 form a closed space to accommodate devices, such as the control circuit 200.

In some embodiments, the case body 300 can be made of flexible materials, such as a plastic case body or a silica gel case body.

Wherein, the control circuit 200 is mounted in the case body 300, the control circuit 200 can be a motherboard of the display device 1000, and the control circuit 200 can integrate one, two or more of a battery, an antenna structure, a microphone, a speaker, a headphone interface, a universal serial bus interface, a camera, a distance sensor, an ambient light sensor, a receiver, and a processor.

Wherein, the light-emitting panel 100 is mounted in the case body 300, and meanwhile the light-emitting panel 100 is electrically connected to the control circuit 200 to form a display surface of the display device 1000. The light-emitting panel 100 can comprise a display area and a non-display area. The display area can be used to display the screen of the display device 1000 or for a user to perform touch manipulation. This non-display area can be used to dispose various functional components.

Figure 2:
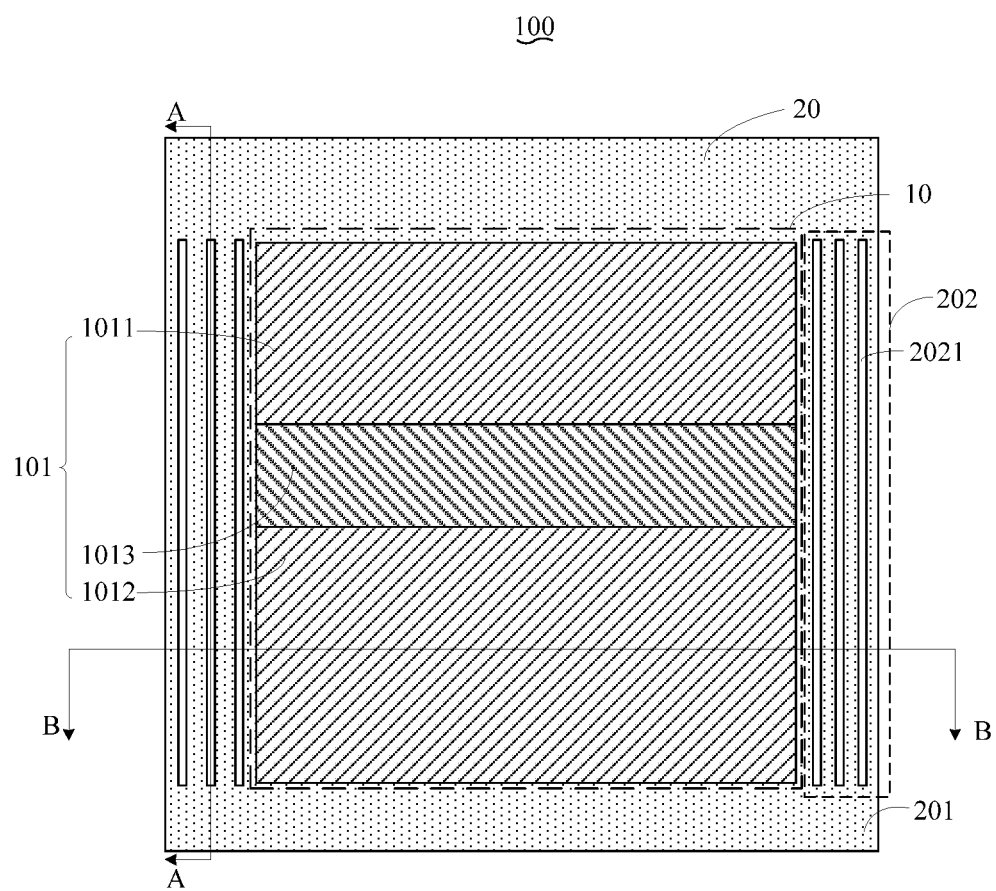
FIG. 2 is a first schematic structural diagram of a light-emitting panel according to an embodiment of the present disclosure.
Figure 3:
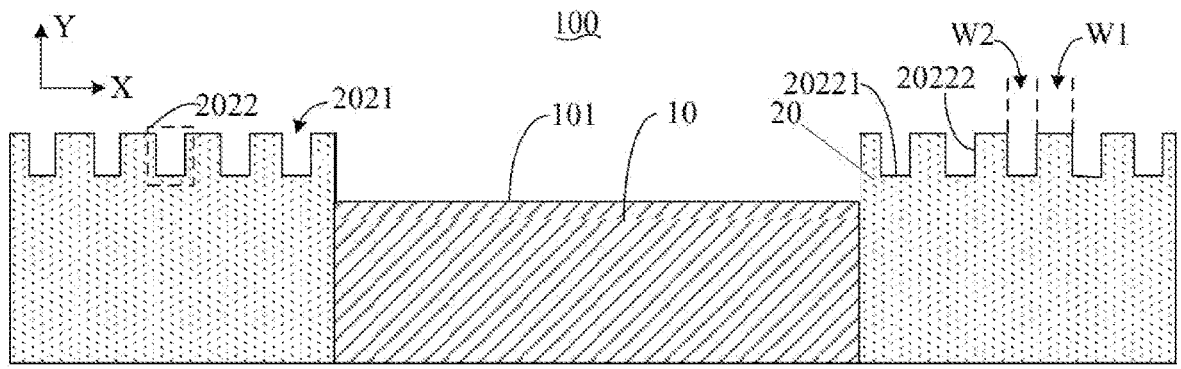
FIG. 3 is a second schematic structural diagram of a light-emitting panel according to an embodiment of the present disclosure.

Referring to FIG. 2 and FIG. 3, FIG. 2 is a first schematic structural diagram of the light-emitting panel 100 according to an embodiment of the present disclosure, and is a top view of the light-emitting panel 100. FIG. 3 is a second schematic structural diagram of the light-emitting panel 100 according to an embodiment of the present disclosure, and is a schematic cross-sectional view of the light-emitting panel 100 in the BB direction of FIG. 2. The light-emitting panel 100 comprises:

a light-emitting substrate 10 having a light-emitting surface 101; and a blocking structure 20 disposed surrounding the light-emitting substrate 10 and not covering the light-emitting surface 101; wherein, a recessed structure 202 is disposed on a first surface 201 of the blocking structure 20, and the first surface 201 is on a same side as the light-emitting surface 101.

Specifically, the light-emitting substrate 10 may include: an anode electrode, a hole injection layer, an organic light-emitting layer, an electron transport layer, and a cathode (not shown in the figure). In addition, it further comprises a drive circuit, the drive circuit drives the light-emitting substrate 10 to emit light, thereby forming the light-emitting surface 101. The light-emitting substrate 10 can also be a flexible substrate made of polyimide (PI). Therefore, the light-emitting surface 101 of the light-emitting substrate 10 can be divided to three parts, the first part is a first display part 1011, the second part is a second display part 1012, and the third part is a bent portion 1013 connected to the first display part 1011 and the second display part 1012.

A circle of blocking structure 20 is disposed around the light-emitting substrate 10, and the light-emitting surface 101 of the light-emitting substrate 10 is uncovered. That is, the blocking structure 20 only surrounds side walls of the light-emitting substrate 10 to prevent shielding the light-emitting surface 101. The blocking structure 20 has the first surface 201 which is on a same side as the light-emitting surface 101. Specifically, Referring to FIG. 3, in FIG. 3, X direction is the horizontal direction, and Y direction is the vertical direction. The light-emitting direction of the light-emitting surface 101 is Y-axis positive direction. Therefore, the first surface 201 is a surface of the blocking structure 20 located in Y-axis positive direction.

Wherein, the recessed structure 202 is disposed on the first surface 201. When preparing an encapsulation layer on the light-emitting substrate 10, the liquid ink can flow into the recessed structure 202 if it overflows that prevents the liquid ink spreading to the surroundings of the light-emitting substrate 10 or flowing to the two upper and lower layers of the inorganic encapsulation layers. The recessed structure 202 may be disposed in parallel with each side of the light-emitting substrate 10, which is not limited herein.

The embodiment of the present disclosure provides the light-emitting panel. The light-emitting panel comprises: a light-emitting substrate having a light-emitting surface and a blocking structure disposed surrounding the light-emitting substrate and not covering the light-emitting surface; wherein, a recessed structure is disposed on a first surface of the blocking structure, and the first surface is on a same side as the light-emitting surface. It can make an overflowed liquid ink which forms an organic layer flow into the recessed structure by disposing the recessed structure on the first surface, thereby making an inorganic layer completely cover the organic layer, preventing encapsulation failure, and improving product yield.

In some embodiments, as shown in FIG. 3, the recessed structure 202 comprises a plurality of first grooves 2022 disposed at intervals, and the first grooves 2022 are formed by first openings 2021 which are disposed on the first surface 201 extending to an interior of the blocking structure 20.

Specifically, the relation of a vertical height of the light-emitting substrate 10 in Y direction and a vertical height of the blocking structure 20 in Y direction is arbitrary. It only needs to ensure that the liquid ink which is used to prepare the organic layer on the light-emitting substrate 10 can flow into the first grooves 2022 through the first openings 2021 when it overflows.

In some embodiments, a width W1 of first intervals between the adjacent first openings is greater than or equal to an opening width W2 of the first openings.

Specifically, W1 can be controlled to be greater than W2 to prevent the problem of the blocking structure 20 being easy to break which is caused by a narrow spacing W1 between adjacent first grooves 2022 when the first grooves 2022 are disposed on the first surface 201. If the width of W2 is less, the width of W1 is greater. Therefore, it needs to control W1 to be greater than W2, and preferably, W1 to be equal to W2.

Figure 4:
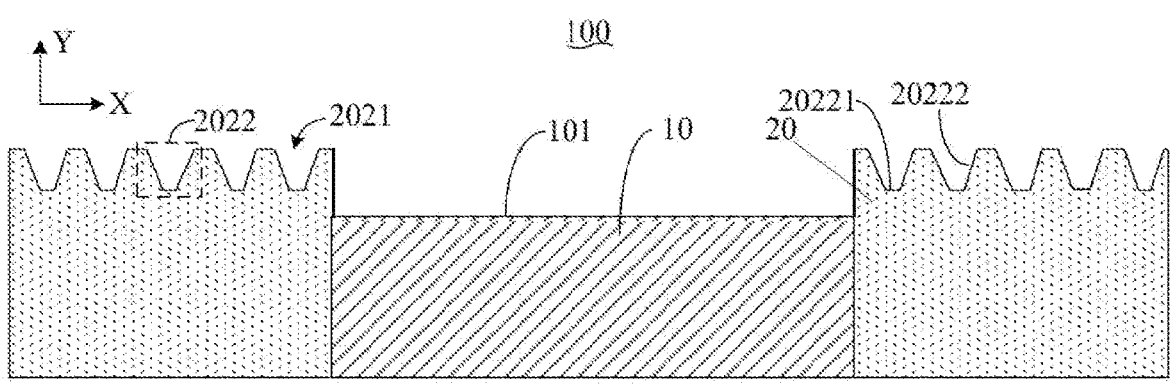
FIG. 4 is a third schematic structural diagram of a light-emitting panel according to an embodiment of the present disclosure.

In some embodiments, as shown in FIG. 4, FIG. 4 is a third schematic structural diagram of the light-emitting panel 100 according to an embodiment of the present disclosure. The first grooves 2022 comprise bottom walls 20221 and side walls 20222 on the bottom walls 20221. An opening width W3 of the first grooves 2022 gradually decreases along an extending direction of the first grooves 2022.

Specifically, the side walls 20222 can have gentle slopes to facilitate the liquid ink more easily to flow into the first grooves 2022. It can be known when compared with FIG. 3, although the relation of W1 and W2 is not changed, a flow distance of the liquid ink on the first surface 201 is less and the liquid ink is easily to flow into the first grooves 2022 due to the gentle slopes. Therefore, the opening width W3 of the first grooves 2022 can be controlled to gradually decrease along an extending direction of the first grooves 2022. Preferably, the side walls 20222 on one side adjacent to the light-emitting substrate 10 can be gentle slopes.

Figure 5:
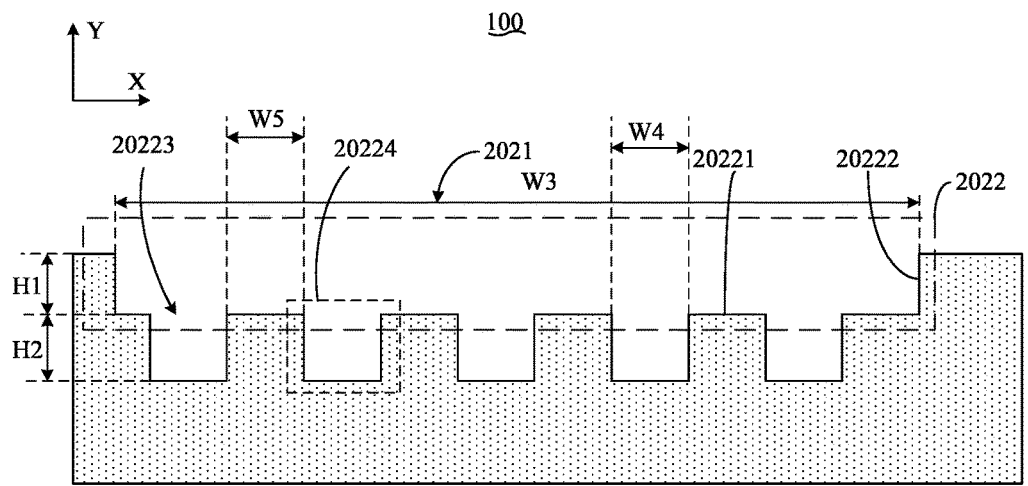
FIG. 5 is a fourth schematic structural diagram of a light-emitting panel according to an embodiment of the present disclosure.

In some embodiments, as shown in FIG. 5, FIG. 5 is a fourth schematic structural diagram of the light-emitting panel 100 according to an embodiment of the present disclosure, and is a schematic cross-sectional view of the light-emitting panel 100 in the AA direction of FIG. 2. A plurality of second openings 20223 is disposed at intervals on the bottom walls 20221, and the second openings 20223 extend to the interior of the blocking structure 202 to form second grooves 20224.

Specifically, a cross-sectional shape of the first grooves 2022 and the second grooves 20224 may be any of a rectangle, a trapezoid, and an arc, which is not limited herein.

Figure 6:
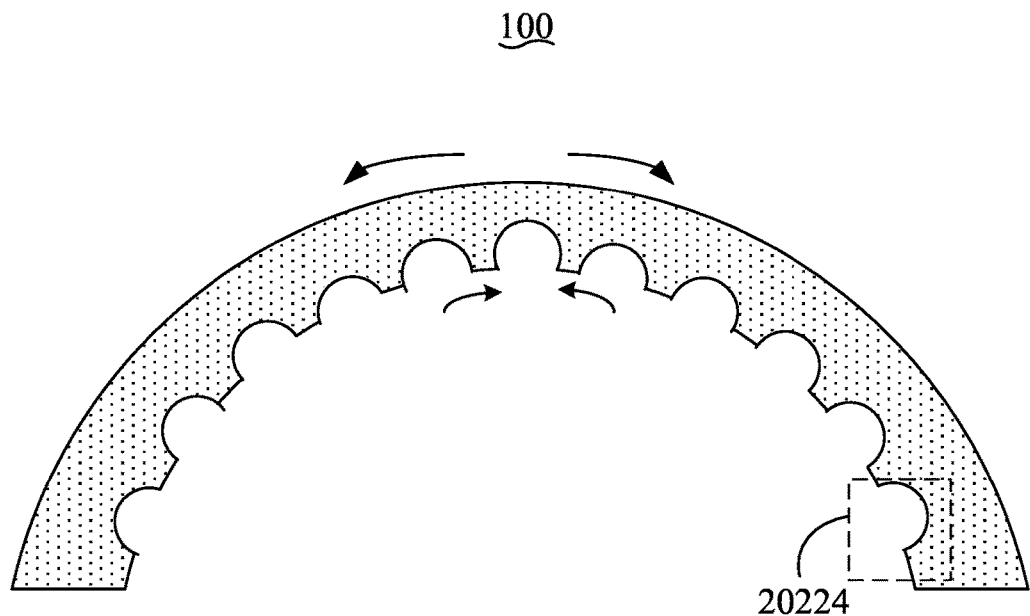
FIG. 6 is a schematic structural diagram of a blocking structure according to an embodiment of the present disclosure.

It can be understood that, when the light-emitting substrate 10 is a flexible substrate, referring to FIG. 6, FIG. 6 is a schematic structural diagram of the blocking structure 20 according to an embodiment of the present disclosure. An arc cross-sectional shape of the second grooves 20224 is taken for example, the light-emitting substrate 10 and the blocking structure 20 are bent by a bending force, and the blocking material on both sides of the second grooves 20224 is filled inside the second grooves 20224 when the light-emitting panel 100 is bent. That is, second grooves 20224 will cause the compressive stress of the blocking material to decrease, and the decreased compressive stress of the blocking material will cause the stress neutral surface to shift to the light-emitting panel 100 or other upper layers, such as the encapsulation layer, when bending the light-emitting panel 100.

In some embodiments, an opening width of the second openings 20223 is less than or equal to a width of the bottom walls 20221.

Figure 7:
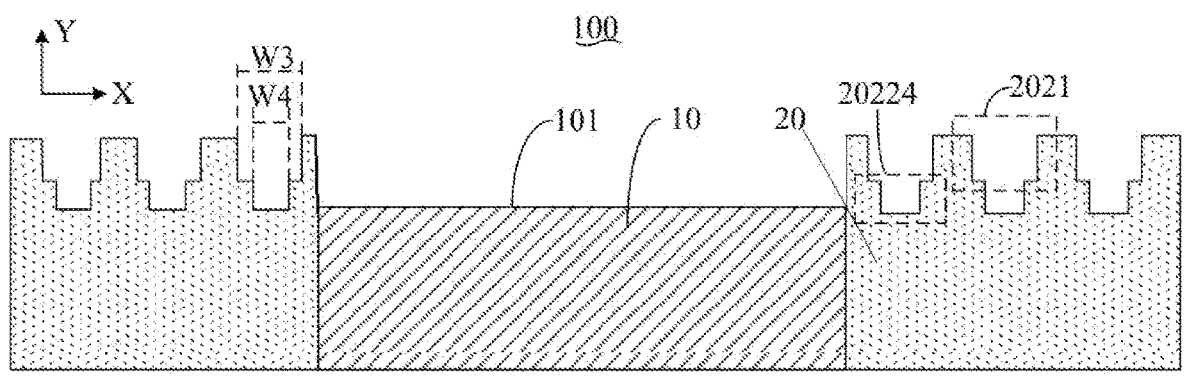
FIG. 7 is a fifth schematic structural diagram of a light-emitting panel according to an embodiment of the present disclosure.

Specifically, the opening width of the second openings 20223 less than or equal to the width of the bottom walls 20221 refers to a width relation of the second openings 20223 and the bottom walls 20221 in the X-axis direction of the AA direction as shown in FIG. 5. It also can refer to a width relation of the second openings 20223 and the bottom walls 20221 in the X-axis direction of the BB direction of the light-emitting panel 100 as shown in FIG. 7. FIG. 7 is a fifth schematic structural diagram of the light-emitting panel 100 according to an embodiment of the present disclosure.

Preferably, the opening width of the second openings 20223 is greater than 2 μm.

In some embodiments, as shown in FIG. 5, a width W5 of second intervals between adjacent second openings is greater than an opening width W4 of the second openings.

Specifically, W5 can be controlled to be greater than W4 to prevent the problem of the blocking structure 20 being easy to break which is caused by a narrow spacing W5 between adjacent second grooves 20224 when the second grooves 20224 are disposed on the bottom walls 20221. In addition, it needs to reserve a bending space for the blocking structure 20 adjacent to the second grooves 20224 when bending. Therefore, W5 is controlled to be greater than W4.

In some embodiments, a depth H1 of the first grooves 2022 is equal to a depth H2 of the second grooves 20224.

The depth of the first grooves refers to a length of the first grooves 2022 in the Y-axis direction, that's H1, and similarly, H2 is a length of the second grooves 20224 in the Y-axis direction. H1 equal to H2 is only a preferred embodiment given here, and it can be H1 greater than H2 or H1 less than H2, which is not limited herein.

Figure 8:
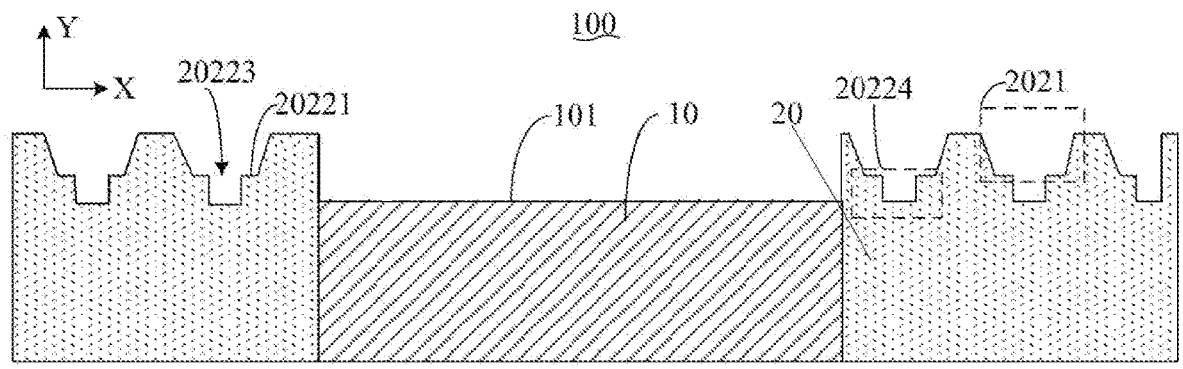
FIG. 8 is a sixth schematic structural diagram of a light-emitting panel according to an embodiment of the present disclosure.

In some embodiments, as shown in FIG. 8, FIG. 8 is a sixth schematic structural diagram of the light-emitting panel 100 according to an embodiment of the present disclosure. FIG. 8 is a situation based on FIG. 4, that the second openings 20223 are disposed on the bottom walls 20221 of the first grooves 2022 and the second grooves 20224 are formed by the second openings 20223 extending to the interior of the blocking structure 20.

Here providing a preferred embodiment, the opening width W3 of the first grooves 2022 gradually decreases along an extending direction of the first grooves 2022, and the second openings 20223 are disposed on the bottom walls 20221 of the first grooves 2022 and the second grooves 20224 are formed by the second openings 20223 extending to the interior of the blocking structure 20.

Figure 9:
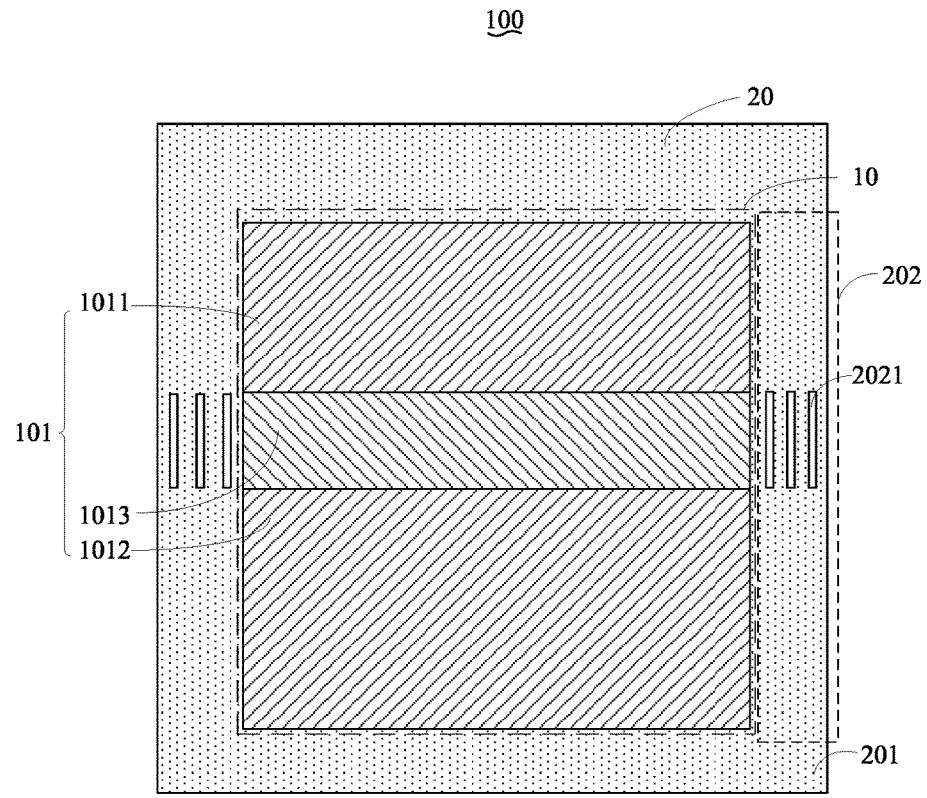
FIG. 9 is a seventh schematic structural diagram of a light-emitting panel according to an embodiment of the present disclosure.

Referring to FIG. 9, FIG. 9 is a seventh schematic structural diagram of the light-emitting panel 100 according to an embodiment of the present disclosure. In some embodiments, the recessed structure 202 is disposed on a part of the first surface 201 opposite to the bent portion 1013.

Here providing a preferred embodiment, that is the recessed structure 202 disposed on a part of the first surface 201 of the blocking structure 20 opposite to the bent portion 1013. In this way, when preparing the encapsulation layer, the spray-coated liquid ink can all flow to the part of the first surface 201 opposite to the bent portion 1013 and then flow inside the recessed structure 202, thereby effectively controlling the flow direction of the liquid ink.

The embodiment of the present disclosure provides a light-emitting panel. The light-emitting panel comprises: a light-emitting substrate having a light-emitting surface and a blocking structure disposed surrounding the light-emitting substrate and not covering the light-emitting surface; wherein, a recessed structure is disposed on a first surface of the blocking structure, and the first surface is on a same side as the light-emitting surface. It can make an overflowed liquid ink which forms an organic layer flow into the recessed structure by disposing the recessed structure on the first surface, thereby making an inorganic layer completely cover the organic layer, preventing encapsulation failure, and improving product yield. In addition, the liquid ink is more easily to flow into the first grooves by controlling the opening width of the first grooves gradually to decrease along the extending direction of the first grooves. Moreover, due to the first grooves and the second grooves, the blocking material on both sides of the first grooves and the second grooves is filled inside the grooves when bending the light-emitting panel, thereby decreasing the compressive stress.

An embodiment of the present disclosure further provides a light-emitting panel. It comprises:
a light-emitting substrate having a light-emitting surface; and
a blocking structure disposed surrounding the light-emitting substrate and not covering the light-emitting surface; wherein,
a recessed structure is disposed on a first surface of the blocking structure, the first surface is on a same side as the light-emitting surface, the recessed structure comprises a plurality of first grooves disposed at intervals, and the first grooves are formed by first openings disposed on the first surface extending to an interior of the blocking structure, the light-emitting substrate comprises a first display part, a second display part, and a bent portion, the bent portion is connected to the first display part and the second display part, and the recessed structure is disposed on a part of the first surface opposite to the bent portion.

Wherein, a width of first intervals between the adjacent first openings is greater than or equal to an opening width of the first openings, the first grooves comprise bottom walls and side walls disposed on the bottom walls, a plurality of second openings are disposed at intervals on the bottom walls, and the second openings extend to the interior of the blocking structure to form second grooves.

The light-emitting panel and the display device provided by the present disclosure are described in detail above. The specific examples are applied in the description to explain the principle and implementation of the disclosure. The description of the above embodiments is only for helping to understand the technical solution of the present disclosure and its core ideas, and it is understood that many changes and modifications to the described embodiment can be carried out without departing from the scope and the spirit of the disclosure that is intended to be limited only by the appended claims.

What is claimed is:

1. A light-emitting panel, comprising:
a light-emitting substrate having a light-emitting surface; and
a blocking structure disposed surrounding the light-emitting substrate and not covering the light-emitting surface; wherein
a recessed structure is disposed on a first surface of the blocking structure, and the first surface is on a same side as the light-emitting surface.

2. The light-emitting panel according to claim 1, wherein the recessed structure comprises a plurality of first grooves defined at intervals, and the first grooves are formed by first openings defined on the first surface extending to an interior of the blocking structure.

3. The light-emitting panel according to claim 2, wherein a width of first intervals between adjacent first openings is greater than or equal to an opening width of the first openings.

4. The light-emitting panel according to claim 2, wherein the first grooves comprise bottom walls and side walls disposed on the bottom walls, a plurality of second openings are defined at intervals on the bottom walls, and the second openings extend to the interior of the blocking structure to form second grooves.

5. The light-emitting panel according to claim 4, wherein an opening width of the second openings is less than or equal to a width of the bottom walls.

6. The light-emitting panel according to claim 4, wherein an opening width of the first grooves gradually decreases along an extending direction of the first grooves.

7. The light-emitting panel according to claim 4, wherein a width of second intervals between adjacent second openings is greater than an opening width of the second openings.

8. The light-emitting panel according to claim 5, wherein a depth of the first grooves is equal to a depth of the second grooves.

9. The light-emitting panel according to claim 1, wherein the light-emitting substrate comprises a first display part, a second display part, and a bent portion, the bent portion is connected to the first display part and the second display part, and the recessed structure is disposed on a part of the first surface opposite to the bent portion.

10. A display device, comprising a light-emitting panel and a case body, the light-emitting panel disposed on the case body and comprising:
a light-emitting substrate having a light-emitting surface; and
a blocking structure disposed surrounding the light-emitting substrate and not covering the light-emitting surface; wherein
a recessed structure is disposed on a first surface of the blocking structure, and the first surface is on a same side as the light-emitting surface.

11. The display device according to claim 10, wherein the recessed structure comprises a plurality of first grooves defined at intervals, and the first grooves are formed by first openings defined on the first surface extending to an interior of the blocking structure.

12. The display device according to claim 11, wherein a width of first intervals between adjacent first openings is greater than or equal to an opening width of the first openings.

13. The display device according to claim 11, wherein the first grooves comprise bottom walls and side walls disposed on the bottom walls, a plurality of second openings are defined at intervals on the bottom walls, and the second openings extend to the interior of the blocking structure to form second grooves.

14. The display device according to claim 13, wherein an opening width of the second openings is less than or equal to a width of the bottom walls.

15. The display device according to claim 13, wherein an opening width of the first grooves gradually decreases along an extending direction of the first grooves.

16. The display device according to claim 13, wherein a width of second intervals between adjacent second openings is greater than an opening width of the second openings.

17. The display device according to claim 14, wherein a depth of the first grooves is equal to a depth of the second grooves.

18. The display device according to claim 10, wherein the light-emitting substrate comprises a first display part, a second display part, and a bent portion, the bent portion is connected to the first display part and the second display part, and the recessed structure is disposed on a part of the first surface opposite to the bent portion.

19. A light-emitting panel, comprising:
a light-emitting substrate having a light-emitting surface; and
a blocking structure disposed surrounding the light-emitting substrate and not covering the light-emitting surface; wherein
a recessed structure is disposed on a first surface of the blocking structure, the first surface is on a same side as the light-emitting surface, the recessed structure comprises a plurality of first grooves defined at intervals, and the first grooves are formed by first openings defined on the first surface extending to an interior of the blocking structure;

the light-emitting substrate comprises a first display part, a second display part, and a bent portion, the bent portion is connected to the first display part and the second display part, and the recessed structure is disposed on a part of the first surface opposite to the bent portion.

20. The light-emitting panel according to claim 19, wherein a width of first intervals between adjacent first openings is greater than or equal to an opening width of the first openings, the first grooves comprise bottom walls and side walls disposed on the bottom walls, a plurality of second openings are defined at intervals on the bottom walls, and the second openings extend to the interior of the blocking structure to form second grooves.

\* \* \* \* \*